US012757502B2

(12) United States Patent
Dai et al.

(10) Patent No.: US 12,757,502 B2
(45) Date of Patent: Oct. 6, 2026

(54) LOW-POWER PHOTONIC DEMODULATOR

(71) Applicant: The Hong Kong University of Science and Technology, Hong Kong (CN)

(72) Inventors: Shunqi Dai, Hong Kong (CN); Man Sun John Chan, Hong Kong (CN)

(73) Assignee: The Hong Kong University of Science and Technology, Hong Kong (CN)

( * ) Notice: Subject to any disclaimer, the term of this patent is extended or adjusted under 35 U.S.C. 154(b) by 1077 days.

(21) Appl. No.: 17/644,580

(22) Filed: Dec. 16, 2021

(65) Prior Publication Data

US 2022/0254945 A1 Aug. 11, 2022

Related U.S. Application Data

(60) Provisional application No. 63/146,724, filed on Feb. 8, 2021.

(51) Int. Cl.
*H10F 30/20* (2025.01)
*G01S 7/4865* (2020.01)
(Continued)

(52) U.S. Cl.
CPC ............ *H10F 30/20* (2025.01); *G01S 7/4865* (2013.01); *G01S 7/4913* (2013.01); *G01S 17/08* (2013.01);
(Continued)

(58) Field of Classification Search
CPC .................. H10F 30/20; H10F 39/199; H04N 2201/03145; H04N 2201/02429;
(Continued)

(56) References Cited

U.S. PATENT DOCUMENTS 8,294,882 B2 10/2012 Van Der Tempel et al.
9,716,121 B1 7/2017 Fotopoulou et al.
(Continued)

FOREIGN PATENT DOCUMENTS

EP 2023399 B1 1/2020

OTHER PUBLICATIONS

Of Radovanovic et al: â3-GB/s Optical Detector in Standard CMOS for 850-nm Optical Communication, â IEEE Journal of Solid-State Circuits, Sep. 2005 (Year: 2005).*
(Continued)

*Primary Examiner* — Marlon T Fletcher
*Assistant Examiner* — Kimberly Newman Frey
(74) *Attorney, Agent, or Firm* — S&F/WEHRW

(57) ABSTRACT

A photo-detector for detecting photons generated by a received light is disclosed. The photo-detector includes a semiconductor substrate, two or more guided regions, a photo sensing region, and two or more detection regions. The semiconductor substrate and the guided regions are doped with the first conductive type of dopant. The photo sensing region is disposed between the two or more guided regions for an impinging photon from the received light to generate photo carriers. The detection regions are doped with a second conductive type of dopant. The guided regions are respectively connected to power sources to apply an electric potential across the guided regions for controlling a detectivity of the impinging photon. The photo sensing region is provided to form at least a pn junction between the guided regions that is reverse biased so as to reduce or prevent a leakage path between the guided regions.

14 Claims, 9 Drawing Sheets

(51) Int. Cl.
*G01S 7/4913* (2020.01)
*G01S 17/08* (2006.01)
*G01S 17/894* (2020.01)
*H10F 39/12* (2025.01)

(52) U.S. Cl.
CPC .......... *G01S 17/894* (2020.01); *H10F 39/199* (2025.01)

(58) Field of Classification Search
CPC ........ H04N 2201/02456; G01S 7/4865; G01S 7/4913; G01S 17/08
See application file for complete search history.

(56) References Cited

U.S. PATENT DOCUMENTS

| | | | | |
|---|---|---|---|---|
| 10,141,369 | B2 * | 11/2018 | Park | G01S 7/4914 |
| 10,310,060 | B2 | 6/2019 | Na et al. | |
| 10,636,831 | B2 | 4/2020 | Ebiko | |
| 10,690,753 | B2 | 6/2020 | Izuhara | |
| 2014/0124843 | A1 * | 5/2014 | Han | H10F 30/221 257/292 |
| 2023/0230985 | A1 * | 7/2023 | Wachmann | H10F 77/306 257/233 |

OTHER PUBLICATIONS

Radovanovic et al; 3-GB/s Optical Detector in Standard CMOS for 850-nm Optical Communication (Year: 2005).*

Radovanovic et al.; "A 3-GB/s Optical Detector in Standard CMOS for 850-nm Optical Communication"; IEEE Journal of Solid-State Circuits, vol. 40, No. 8, Aug. 2005 (Year: 2005).*

Radovanovic et al.; "3-GB/s Optical Detector Standard CMOS for 850-nm Optical Communication,:" IEEE Journal of Solid-State Circuits, Sep. 2005 (Year: 2005).*

Van der Tempel, W., Van Nieuwenhove, D., Grootjans, R., and Kuijk, M, "An active demodulation pixel using a current assisted photonic demodulator implemented in 0.6 um standard CMOS," in IEEE International Conference on Group IV Photonics, 2006, pp. 116-118.

Dalla Betta, G. F., Donati, S., Hossain, Q. D., Martini, G., Pancheri, L., and Saguatti, D., "Design and Characterization of Current-Assisted Photonic Demodulators in 0.18-um CMOS Technology," IEEE International Electron Devices Meeting (IEDM), 2018, pp. 32-34, Dec. 2018.

Na, N., Cheng, S. L., Liu, H. D., Yang, M. J., Chen, C. Y., Chen, H. W., and Chen, S. L., "High-performance Germanium-an-Silicon Lick-in Pixels for Indirect Time-of-Flight Applications," in IEEE International Electron Devices Meeting (IEDM), 2018, pp. 32-34 Dec. 2018.

Kato, Y., Sano, T., Moriyama, Y., Maeda, S., Yamazaki, T., Nose, A., and Sukegawa, S., "320×240 Back-Illuminated 10-um CAPD Pixels for High-Speed Modulation Time-of-Flight CMOS Image Sensor," IEEE Journal of Solid-State Circuits, vol. 53, No. 4,pp. 1071-1078.

* cited by examiner

LOW-POWER PHOTONIC DEMODULATOR

CROSS-REFERENCE TO RELATED APPLICATIONS

This application claims the benefit of the U.S. Provisional Patent Application No. 63/146,724, filed on Feb. 8, 2021, which is incorporated by reference herein in its entirety.

LIST OF ABBREVIATIONS 2D two dimensional
3D three dimensional
ADAS advanced driver assistance
BSI back-side illumination
CAPD current-assisted photonic demodulator
CMOS complementary metal-oxide semiconductor
DA/DB detection region (A or B)
GA/GB guided region (A or B)
IC integrated circuit
ISO isolation
LiDAR light detection and ranging
LED light emitting diode
NWELL n-well
PD photo sensing
PWELL p-well
TOF time-of-flight
VCSEL vertical-cavity surface-emitting laser

FIELD OF THE INVENTION

The present invention relates broadly to a photonic demodulator device, and in particular, to a photo-detector for detecting an impinging electromagnetic radiation from a received light, which can be used in a TOF image sensor for performing distance measurement and 3D imaging.

BACKGROUND OF THE INVENTION

TOF technology is revolutionizing the distance sensing technologies by providing a perception of depth with high accuracy rate in real-time. The distance between a sensor and an object is determined based on the time difference between the emission of a signal and the respective return signal. The TOF image sensor can instantaneously detect the distance of a surface of an object based on the time of an emitted light to be reflected and returned to the source.

The most common type of TOF image sensor is the LiDAR sensor, which is commonly used in autonomous driving or ADAS vehicle. The TOF image sensor determines the range information accurately by a round trip of time of flight from the source to a target. In another word, during operation, the TOF image sensor emits modulated ranging light (or called emission light, such as near-infrared light), and receives the return light (or called receiving light) after the modulated ranging light meets an object. The TOF image sensor can determine the distance of the photographed scene by calculating the time difference between light emission and reflection, or by calculating the phase difference between the modulated ranging light pulse signal and the returning light pulse signal for generating the depth information. Combined with traditional imaging technology, the TOF image sensor can obtain the three-dimensional topology of the object in a topographic map, preferably indicated by different colors for representing different distances. TOF technology has been widely used in three-dimensional vision, unmanned aerial vehicles, face recognition, robotics, and other fields, and it will become one of the most important technologies for the realization of our future intelligent living environment.

The TOF image sensor usually includes ranging pixels and pixel circuits. Particularly, the ranging pixels in the TOF image sensor are used to modulate the photo-generated charges, and the pixel circuits in the TOF image sensor are used to obtain the image distance information, which is calculated based on the modulated charge information. FIG. 1 shows an embodiment of the CAPD in accordance with the prior art, which is commonly used in optical-electric signal modulation for distance measurement. The underlying concept of the CAPD is detailed in EP 2,023,399 B1. Compared with other technologies for the same purpose, CAPD can achieve high-speed demodulation for obtaining more sensitive distance information. The CAPD can also be integrated in the existing IC fabrication process easily. However, the CAPD suffers from a very high power consumption due to the direct current at the substrate, making it difficult to be used in battery-powered devices and apparatuses.

The conventional CAPD 100 forms two guide regions with one doping type (for example, p-type) 140, 150 in the substrate 110 to realize the modulation of the photo-generated charge. Generally, the conventional CAPD 100 needs an external power supply to apply voltages on the guided regions 140, 150 to generate a large current between two guided regions 140, 150 associated with an electric field in the silicon substrate 110. Electromagnetic masks 50, such as metal masks, can be deployed above the guided regions 140, 150 to shield and prevent impingement of electromagnetic radiation, such as light. When a photon is incident on the silicon substrate 110 between the electromagnetic masks 50, photo-generated charges will be generated at a certain position and directed by the electric field in the silicon substrate 110. The photo-generated charges will be collected by one of the two regions doped with an opposite doping type to the guide region (n-type) in the semiconductor substrate 110 that worked as detection nodes 120, 130. As the total resistance between the two guided regions 140, 150 is very small, when the conventional CAPD 100 modulates the photo-generated charge, there is a problem that a large current of the external power supply will flow into the silicon substrate 110 to form the assisted electric field. Therefore, the large current will lead to the problem of high power consumption in TOF image sensing.

U.S. Pat. No. 9,716,121 B1 provides one existing approach in solving the problem. The photo-generated charges modulation device is characterized in that the locations of the detection region and guided region are rearranged. The guided region is surrounded by the detection region to avoid the leakage current in the surface of the substrate. However, there is still a leakage path in the silicon bulk and the power consumption cannot be reduced substantially.

The disclosure of U.S. Pat. No. 10,141,369 B2 also attempts to address the high power consumption issue by reducing or preventing a leakage current. The photo-detector includes a blocking region disposed between the detection region and the guard region to block a leakage current between the detection region and the guard region. However, the isolation is still focused on avoiding a leakage current in the surface of the substrate without addressing the leakage path in the silicon bulk. Other examples of CAPD and TOF image sensor are shown in U.S. Pat. Nos. 8,294,882 B2; 10,310,060 B2; 10,636,831 B2; and 10,690,753 B2.

Accordingly, there is a need in the art for a structure of the CAPD that seeks to address at least some of the above problems identified in a TOF image sensor. Furthermore, other desirable features and characteristics will become apparent from the subsequent detailed description and the appended claims, taken in conjunction with the accompanying drawings and this background of the disclosure.

SUMMARY OF THE INVENTION

In the light of the foregoing background, it is an objective of the present disclosure to provide a low power photo-detector for detecting photons generated by a received light and a TOF image sensor with substantially lower power consumption.

In accordance with the first embodiment of the present disclosure, the photo-detector includes a semiconductor substrate doped with a first conductive type of dopant, two or more guided regions, a photo sensing region, and two or more detection regions. The two or more guided regions are formed in the semiconductor substrate and doped with the first conductive type of dopant. The photo sensing region is disposed between the two or more guided regions for an impinging photon from the received light to generate photo carriers. The two or more detection regions are formed in the semiconductor substrate and doped with a second conductive type of dopant. The two or more guided regions are respectively connected to power sources to apply an electric potential across the two or more guided regions for controlling a detectivity of the impinging photon. The photo sensing region is provided to form at least a pn junction between the two or more guided regions that is reverse biased so as to reduce or prevent a leakage path between the two or more guided regions.

In accordance with a further aspect of the present disclosure, the photo sensing region is doped with the second conductive type of dopant.

In accordance with a further aspect of the present disclosure, the photo sensing region comprises three or more sub-regions, wherein any two adjacent sub-regions are doped with different conductive type of dopants selected from the first and the second conductive type of dopants.

In one embodiment, the three or more sub-regions are arranged laterally alternating to form a lateral sequence of doping regions.

In another embodiment, the three or more sub-regions are arranged vertically alternating to form a vertical sequence of doping regions.

In accordance with a further aspect of the present disclosure, the photo-detector further comprises an isolation region arranged to surround the two or more guided regions and the two or more detection regions, so as to isolate the two or more guided regions and the two or more detection regions from the semiconductor substrate.

In accordance with a further aspect of the present disclosure, the isolation region is doped with the second conductive type of dopant.

In accordance with a further aspect of the present disclosure, the two or more guided regions comprise a first guided region positioned immediately adjacent to a first side of the photo sensing region, and a second guided region positioned immediately adjacent to a second side of the photo sensing region.

In one embodiment, the first conductive type of dopant is a p-type doping, and the second conductive type of dopant is an n-type doping.

In another embodiment, the first conductive type of dopant is an n-type doping, and the second conductive type of dopant is a p-type doping.

In accordance with a further aspect of the present disclosure, the two or more guided regions and the two or more detection regions are formed in a back side of the semiconductor substrate such that the photo-detector has a BSI structure.

In accordance with the second embodiment of the present disclosure, a TOF imaging system for performing distance measurement and 3D imaging is provided. The TOF imaging system includes a modulated light source for transmitting a light pulse to a target object, a processor, and a receiving unit comprising one or more phase-sensitive photo-detectors for detecting photons generated by a received light reflected from the target object.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter. Other aspects and advantages of the present invention are disclosed as illustrated by the embodiments hereinafter.

BRIEF DESCRIPTION OF THE DRAWINGS

The appended drawings contain figures to further illustrate and clarify the above and other aspects, advantages, and features of the present disclosure. It will be appreciated that these drawings depict only certain embodiments of the present disclosure and are not intended to limit its scope. It will also be appreciated that these drawings are illustrated for simplicity and clarity and have not necessarily been depicted to scale. The present disclosure will now be described and explained with additional specificity and detail through the use of the accompanying drawings in which.

DETAILED DESCRIPTION OF THE INVENTION

Figure 1:
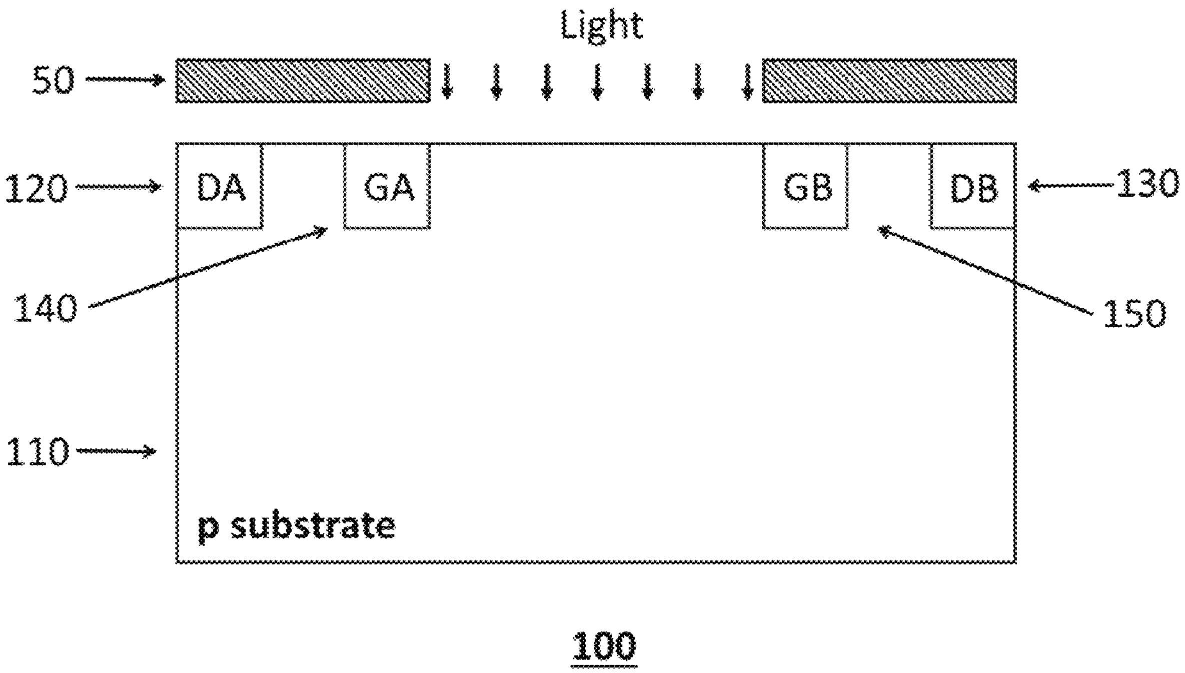
FIG. 1 (Prior Art)
FIG. 1 depicts a cross-section of a conventional photo-detector according to the prior art.

The present disclosure generally relates to a photo-detector device structure. More specifically, but without limitation, the present disclosure relates to a photo-detector device structure without leakage current between the two guided regions and the substrate. An objective of the present disclosure is to provide a TOF image sensor for depth perception with substantially lower power consumption.

The following detailed description is merely exemplary in nature and is not intended to limit the disclosure or its application and/or uses. It should be appreciated that a vast number of variations exist. The detailed description will enable those of ordinary skilled in the art to implement an exemplary embodiment of the present disclosure without undue experimentation, and it is understood that various changes or modifications may be made in the function and structure described in the exemplary embodiment without departing from the scope of the present disclosure as set forth in the appended claims.

The use of the terms "a" and "an" and "the" and "at least one" and similar referents in the context of describing the invention (especially in the context of the following claims) are to be construed to cover both the singular and the plural, unless otherwise indicated herein or clearly contradicted by context. The terms "comprising," "having," and "including" are to be construed as open-ended terms (i.e., meaning "including, but not limited to,") unless otherwise noted. The use of any and all examples, or exemplary language (e.g., "such as") provided herein, is intended merely to illuminate the invention better and does not pose a limitation on the scope of the invention unless otherwise claimed. No language in the specification should be construed as indicating any non-claimed element as essential to the practice of the invention.

The benefits, advantages, solutions to problems, and any element(s) that may cause any benefit, advantage, or solution to occur or become more pronounced are not to be construed as a critical, required, or essential features or elements of any or all of the claims. The invention is defined solely by the appended claims including any amendments made during the pendency of this application and all equivalents of those claims as issued.

As used herein throughout the specification, notations of n+, n, n− and p+, p, p− indicate relative levels of impurity concentration in each conductivity type. That is, an n-type impurity concentration of n+ is relatively higher than that of n, and an n-type impurity concentration of n− is relatively lower than that of n. Further, a p-type impurity concentration of p+ is relatively higher than that of p, and a p-type impurity concentration of p− is relatively lower than that of p. It should be noted that, for simplicity and clarity, there may be cases where n+-type and n−-type are simply described as "n-type" and p+-type and p−-type are simply described as "p-type".

These examples and other embodiments described in the present disclosure may be implemented in one single die or in separate dies. Alternatively, the invention can also be embedded in an integrated circuit with intellectual property blocks. Various modes can be implemented according to the examples described in the present disclosure. As an ordinary skilled person in the art will easily understand after reading the present disclosure, additional or other benefits can be achieved through various examples.

Unless otherwise defined, all terms (including technical and scientific terms) used in the embodiments of the present invention have the same meaning as commonly understood by an ordinary skilled person in the art to which the present invention belongs.

Figure 2:
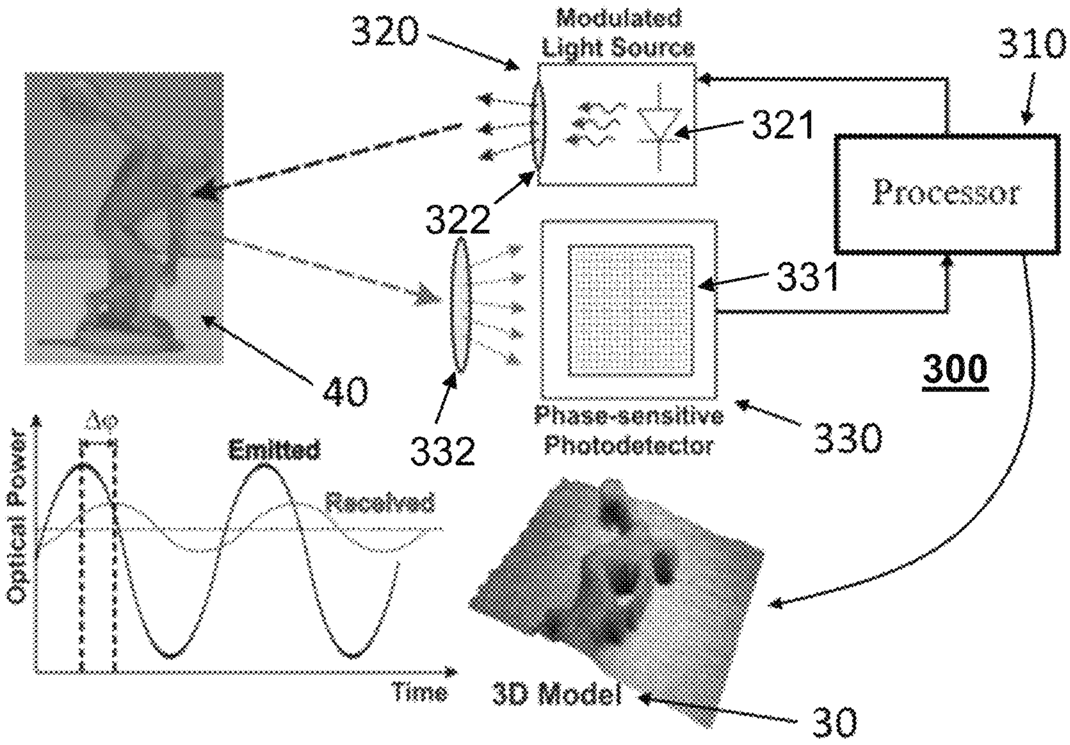
FIG. 2 depicts the operation of a TOF imaging system for performing distance measurement and 3D imaging of a target object in accordance with certain embodiments of the present disclosure.

FIG. 2 depicts the operation of a TOF imaging system 300 for performing distance measurement and 3D imaging of a target object 40 or a scene. In a typical configuration, the TOF imaging system 300 comprises a processor 310, a modulated light source 320, and a receiving unit 330. The TOF image system 300 is configured to analyze the time of flight of light to the target object 40. In particular, the modulated light source 320 has an illumination unit 321, such as a laser diode, a photodiode, a VCSEL, a LED array, which is configured to transmit a light pulse of a predetermined wavelength to the target object 40 and illuminate the field of view. In certain embodiments, the modulated light source 320 may include a collimating lens 322 configured to collimate the light pulse to propagate to the target object 40. The light pulse is reflected back from the target object 40 and collected by the receiving unit 330. Depending on the distance between the target object 40 and the TOF imaging system 300, a time delay or a phase shift is measured between the light pulse from the modulated light source 320 and the reception of a received light at the receiving unit 330 as reflected from the target object 40. For the realization of the detection, the receiving unit 330 comprises a lens 332 and one or more phase-sensitive photo-detectors 331 for detecting the photons generated by the received light reflected from the target object 40. In certain embodiments, the one or more phase-sensitive photo-detectors 331 can be implemented with the CMOS technology. Therefore, it can be fully integrated in the standard IC fabrication process, which may be arranged in an array and fabricated on a semiconductor substrate 110 together with other peripheral circuitry. The array is essentially a 2D arrangement of pixels in rows and columns for representing the target object 40, and together with the depth information for each pixel, a 3D model 30 can be obtained.

The TOF imaging system 300 may include other control circuity and/or optical elements without departing from the scope and spirit of the present disclosure. The processor 310 may be a general-purpose processor or a special-purpose processor, which is configured to determine the characteristics of the target object 40 based on the received light. The determination of the phase differences can be carried out by CAPDs after the reflected light is received at the receiving unit 330. The phase difference Aq can be determined for each pixel for deriving the 3D model 30 in associated with the target object 40.

Figure 3:
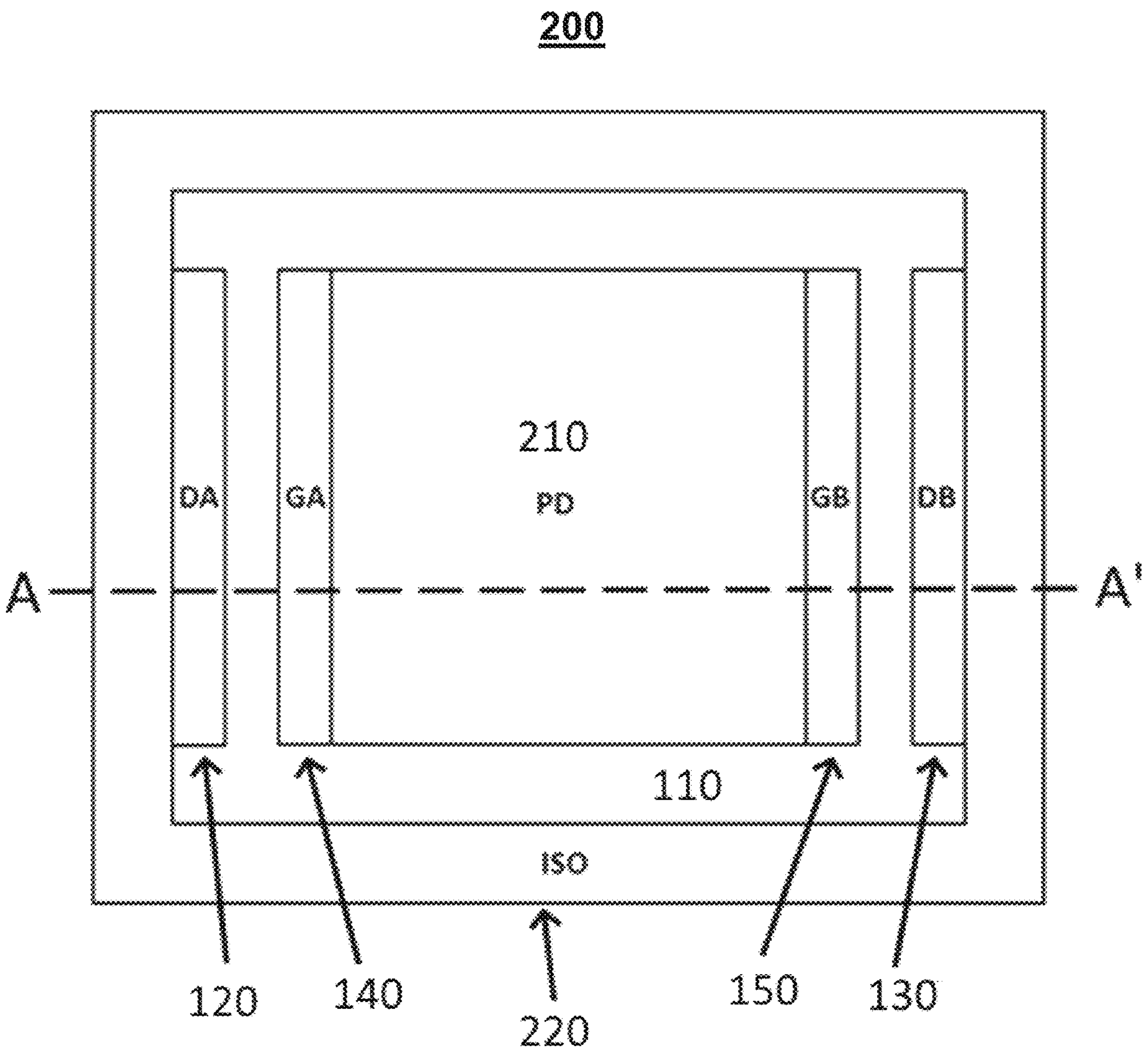
FIG. 3 depicts a top view of a photo-detector in accordance with the first embodiment of the present disclosure.
Figure 4:
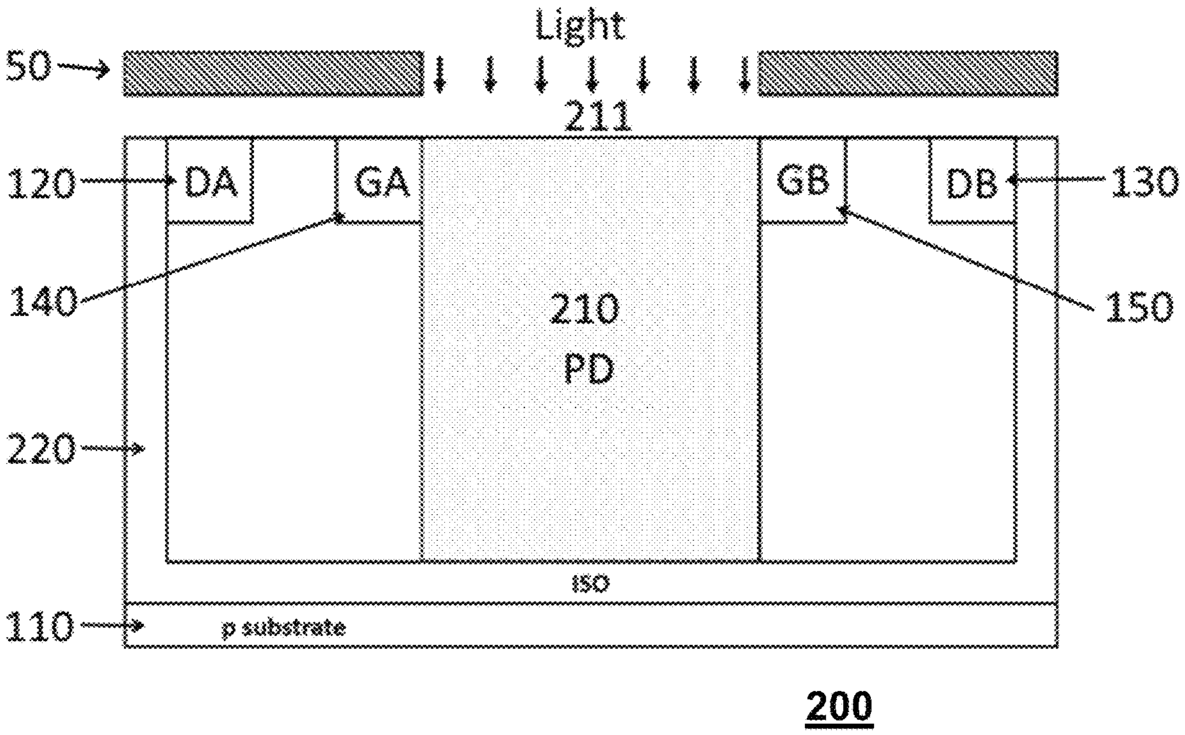
FIG. 4 depicts a cross-section of the photo-detector of FIG. 3 along the A-A' line in accordance with the first embodiment of the present disclosure.

FIG. 3 and FIG. 4 illustrate a CMOS photo-detector 200 used for modulating optical signal and electrical signal in accordance with the first embodiment. The photo-detector 200, such as a CAPD, comprises a semiconductor substrate 110 having a light receiving region 211, a photo sensing region 210, two or more guided regions 140, 150, and two or more detection regions 120, 130. For simplicity and convenience, the subsequent disclosure recites a photo-detector 200 comprising two guided regions 140, 150, and two detection regions 120, 130. A skilled person in the art shall understand that the invention does not preclude a photo-detector 200 to have more than two guide regions and/or more than two detection regions. Therefore, it is apparent that the invention is not confined to two guide regions and two detection regions, but should comprise all embodiments having two or more guide regions and/or two or more detection regions.

The two guided regions 140, 150 and two detection regions 120, 130 are formed in the semiconductor substrate 110 outside the light receiving region 211. The photo sensing region 210 is disposed on the semiconductor substrate 110 between the two guided regions 140, 150. On the left of the photo sensing region 210, the guided region GA 140 and the detection region DA 120 form a demodulation node, which may be referred to as the first tap. Similarly, on the right of the photo sensing region 210, the guided region GB 150 and the detection region DB 130 form another demodulation node, which may be referred to as the second tap. Electromagnetic masks 50, such as metal masks, can be deployed to define the light receiving region 211 by shielding and preventing impingement of electromagnetic radiation.

The semiconductor substrate 110 may be a p-type substrate, which is referred to as doped with a first conductive type of dopant. The photo sensing region 210 may be an n-type region, which is referred to as doped with a second conductive type of dopant. The photo sensing region 210 may also comprise any combination of the following: N+, NWELL, or deep NWELL. At each side of the photo sensing region 210 is a substrate or a well of the first doping type, with the two guided regions 140, 150. Optionally, the two guided regions 140, 150 comprise a first guided region and a second guided region respectively positioned immediately adjacent to a first side and a second side of the photo sensing region 210. The two guided regions 140, 150 are doped with the first conductive type of dopant, such as p+ doped. The two guided regions 140, 150 may also comprise any combination of the following: P+, PWELL, or deep PWELL. A high doped P+ is disposed on the top of the guided region to form an ohmic contact.

The nature of having two adjacent and oppositely doped regions can form a pn junction and create a depletion region. The depletion region width in the semiconductor depends on the doping concentration. When the doping concentration in the photo sensing region 210 is low enough, the entire photo sensing region 210 is depleted and creates a large resistance to avoid the leakage between the guided regions 140, 150. As a result, the photo sensing region 210 is provided to form at least a pn junction between the two guided regions 140, 150 to achieve current insulation, while electric field is allowed to propagate. The two guide regions 140, 150 are connected to external voltage to generate an electric field in the photo sensing region 210 which directing the photo generated carriers toward one of the detection regions 120, 130.

The two detection regions 120, 130 are doped with the second conductive type of dopant (such as n+ doped), which is opposite to the first conductive type of dopant. The detection region 120, 130 may also comprise any combination of the following: N+, NWELL, or deep NWELL. A high doped N+ is disposed on the top of the detection region to form an ohmic contact.

The photo sensing region 210 is provided for sensing an impinging photon from the received light by generating photo carriers. The two guided regions 140, 150 are respectively connected to power sources to apply an electric potential across the two guided regions 140, 150 for controlling a detectivity of the impinging photon. When the electric potential applied has a higher voltage on the guided region GA 140 and a lower voltage on the guided region GB 150, The power sources generate an electric field in the photo sensing region 210, thereby the impinging photon can generate photo carriers (or known as minority carriers, such as electrons) and drift to the two detection regions 120, 130 near a higher bias guided region by the electric field. Advantageously, the photo sensing region 210, which is a depletion region with high resistance and lack of carriers, avoids a leakage current between the two guided regions 140, 150, and effectively achieves a low power consumption.

The two detection regions 120, 130 are respectively placed near the two guided regions 140, 150. The two detection regions 120, 130 collect photo carriers generated in the photo sensing region 210 by the received light. The two guided regions 140, 150 generate a majority carrier current which is used as a guide current for moving the electrons. The two detection regions 120, 130 collect different amounts of the photo carriers, which depend on the direction of the electric field. And the different amounts of photo carriers provide the phase information of the signal, which can be used to determine the distance of the target object 40 reflecting and transmitting the received light to the photo-detector 200.

In certain embodiments, the photo sensing region 210 is located between the first tap and the second tap. The photo-detector 200 further comprises an isolation region 220 (labeled as "ISO" in the illustrations) arranged to surround the two guided regions 140, 150 and the two detection regions 120, 130. Preferably, the isolation region 220 is doped with the second conductive type of dopant (such as n+ doped). The isolation region 220 may also comprise any combination of the following: N+, NWELL, or deep NWELL, thereby the isolation region 220 is arranged to cut-off the leakage path between the two guided regions 140, 150 and the semiconductor substrate 110, and isolate the two guided regions 140, 150 and the two detection regions 120, 130 from the semiconductor substrate 110.

This illustrates the fundamental structure of the photo-detector 200 in accordance with the first embodiment of the present disclosure. Two variations will also be discussed in the subsequent disclosure below, which are respectively referred to as the second and third embodiments.

Figure 5:
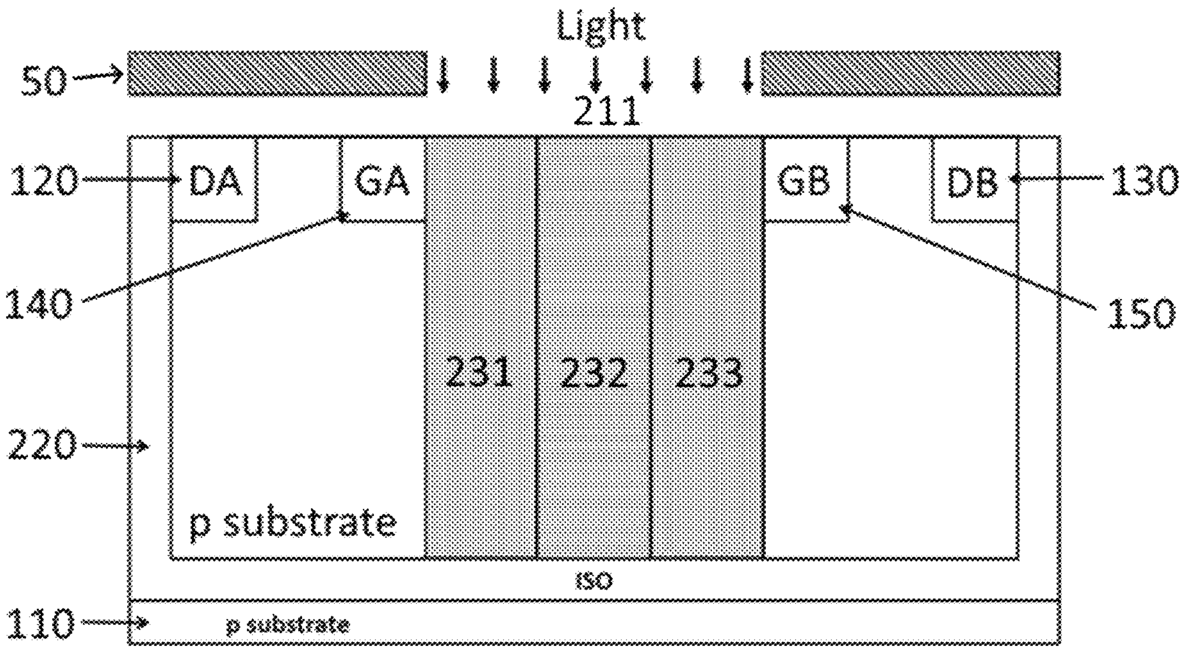
FIG. 5 depicts a cross-section of the photo-detector in accordance with the second embodiment of the present disclosure, wherein the photo sensing region is a lateral sequential of alternative regions with opposite doping types.

As illustrated in FIG. 5, an alternative structure of photo sensing region 210 is disclosed. The photo sensing region 210 comprises three or more sub-regions 231, 232, 233, wherein any two adjacent sub-regions are doped with a different conductive type of dopants selected from the first and the second conductive type of dopants. For example, the first and the third sub-regions 231, 233 are doped with the first conductive type of dopant (such as p-type doping), while the second sub-region 232 is doped with the second conductive type of dopant (such as n-type doping). The three or more sub-regions 231, 232, 233 are arranged laterally alternating to form a lateral sequence of doping regions with opposite doping types.

Figure 6:
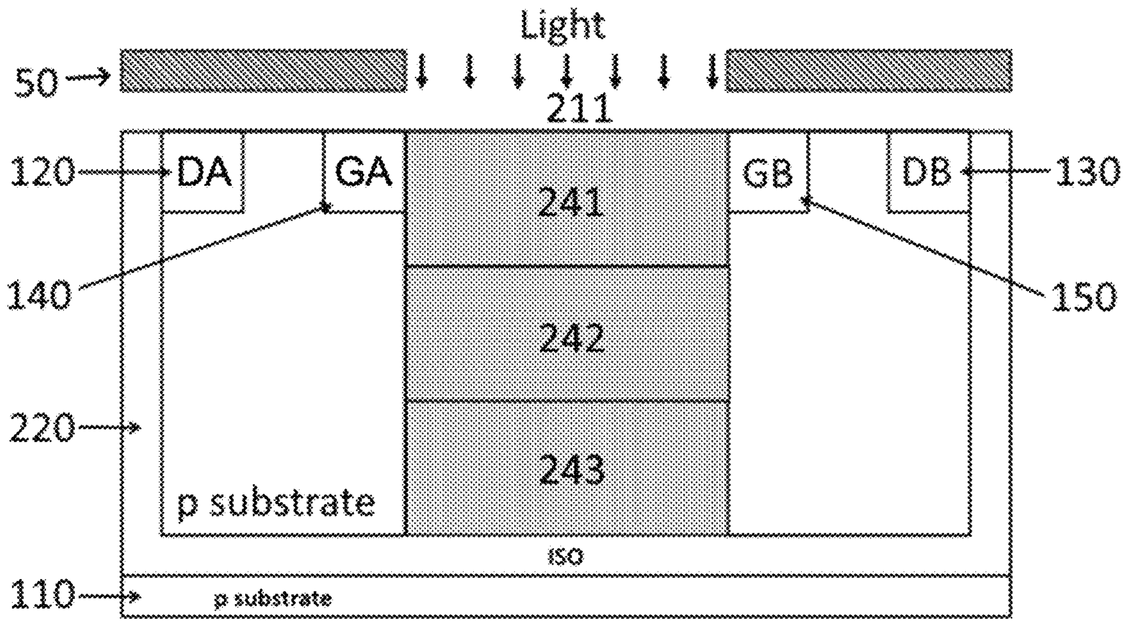
FIG. 6 depicts a cross-section of the photo-detector in accordance with the third embodiment of the present disclosure, wherein the photo sensing region is a vertical sequential of alternative regions with opposite doping types.

As illustrated in FIG. 6, a further alternative structure of photo sensing region 210 is disclosed. The photo sensing region 210 comprises three or more sub-regions 241, 242, 243, wherein any two adjacent sub-regions are doped with a different conductive type of dopants selected from the first and the second conductive type of dopants. For example, the first and the third sub-regions 241, 243 are doped with the first conductive type of dopant (such as p-type doping), while the second sub-region 242 is doped with the second conductive type of dopant (such as n-type doping). The three or more sub-regions 241, 242, 243 are arranged vertically alternating to form a vertical sequence of doping regions with opposite doping types.

In the second and third embodiments, the photo sensing region 210 comprises of a sequential of alternative sub-regions with opposite doping types to achieve current insulation between the two guided regions 140, 150, while allowing the electric field to propagate. The number of sub-regions shall be more than or equal to three so as to form at least two oppositely doped sub-region pairs. Each adjacent oppositely doped sub-region pair forms a pn junction and creates a depletion region. When all the depletion regions in the oppositely doped sub-region pairs are merged, the photo sensing region 210 is fully depleted and creates a large resistance to avoid the leakage between the two guided regions 140, 150.

Compared with the conventional approaches, the present disclosure provides the following advantages: (1) the photo-detector 200 can be fabricated directly using existing commercial IC fabrication process together with other peripheral circuitry; (2) the photo-detector 200 can achieve fast switching for more sensitive signal detection; and (3) unnecessary direct current between the two guided regions 140, 150 is eliminated and minimized to achieve significant power reduction. Therefore, the present disclosure can be used for performing TOF imaging in portable devices.

Figure 7:
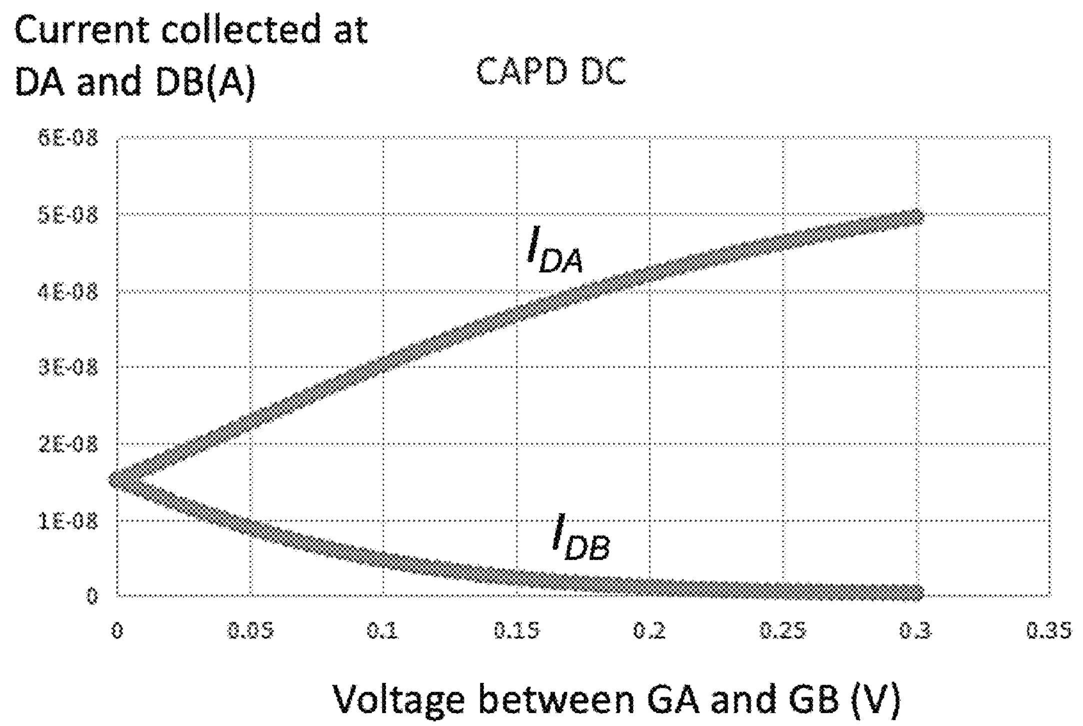
FIG. 7 is graph showing the current collected at the detection regions DA and DB for the conventional photo-detector.
Figure 8:
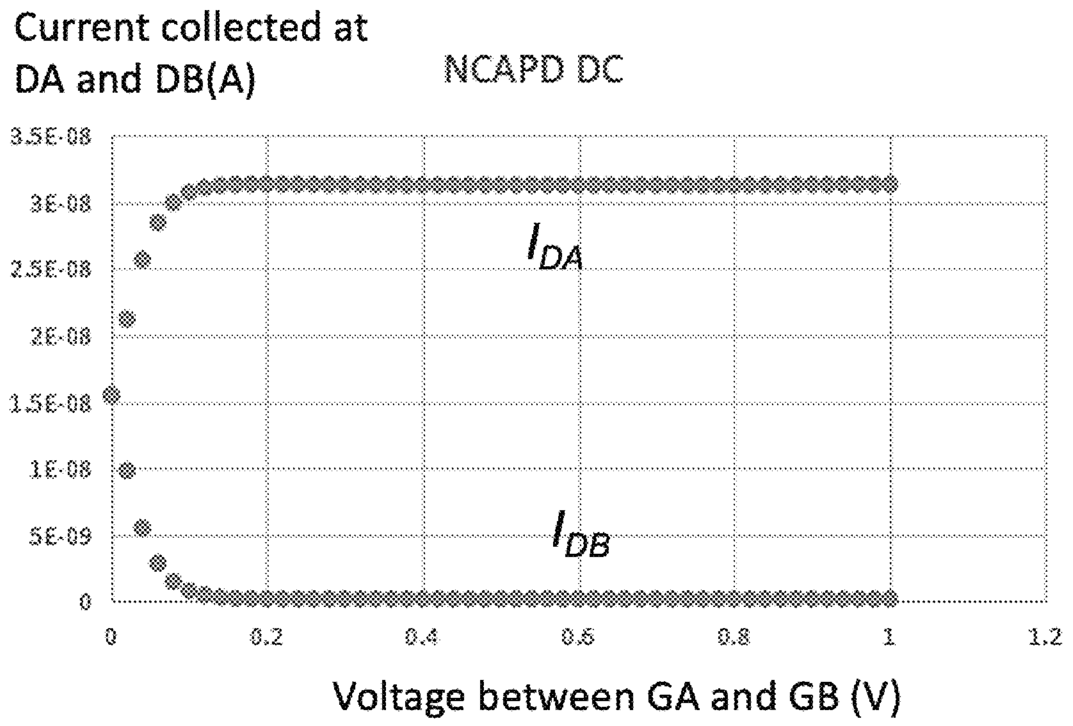
FIG. 8 is graph showing the current collected at the detection regions DA and DB for the photo-detector in accordance with the first embodiment of the present disclosure.
Figure 9:
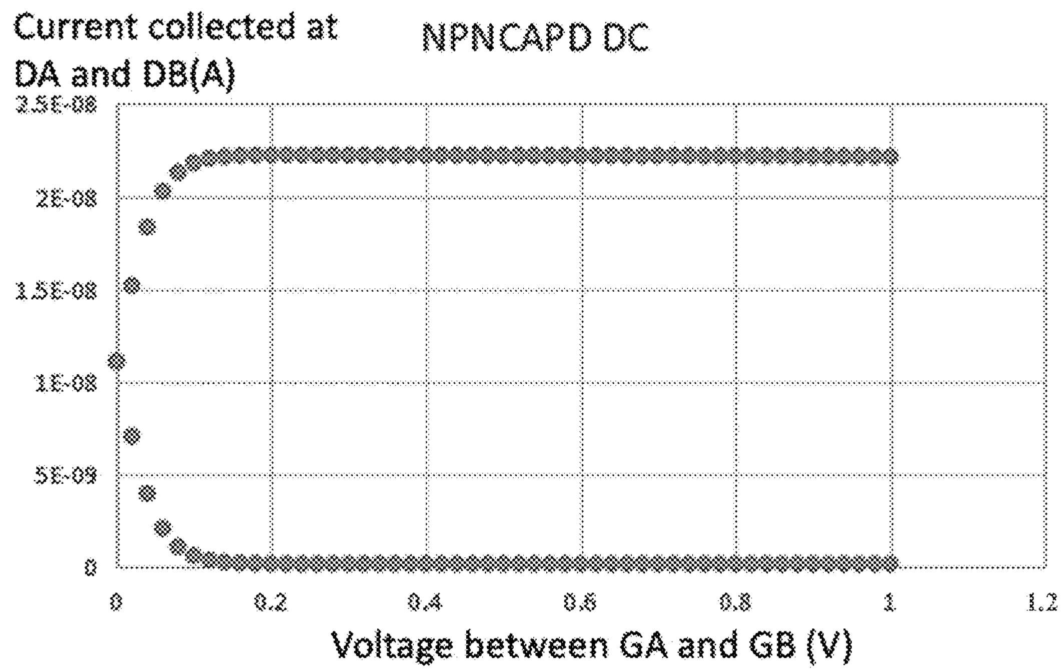
FIG. 9 is graph showing the current collected at the detection regions DA and DB for the photo-detector in accordance with the second embodiment of the present disclosure.

FIG. 7 shows the current collected at the detection region DA and DB 120, 130 as obtained from a conventional CAPD when the voltage between the two guided regions GA and GB 140, 150 increases. In contrast, FIGS. 8-9 show the current collected at the detection region DA and DB 120, 130 as obtained from the photo-detectors 200 of the first and the second embodiments of the present disclosure when the voltage between the two guided regions GA and GB 140, 150 increases. The modulation contrast of the three cases can be compared. There is no significant difference in the current collected from the detection regions 120, 130 when the voltage between the two guided regions 140, 150 increases.

Figure 10:
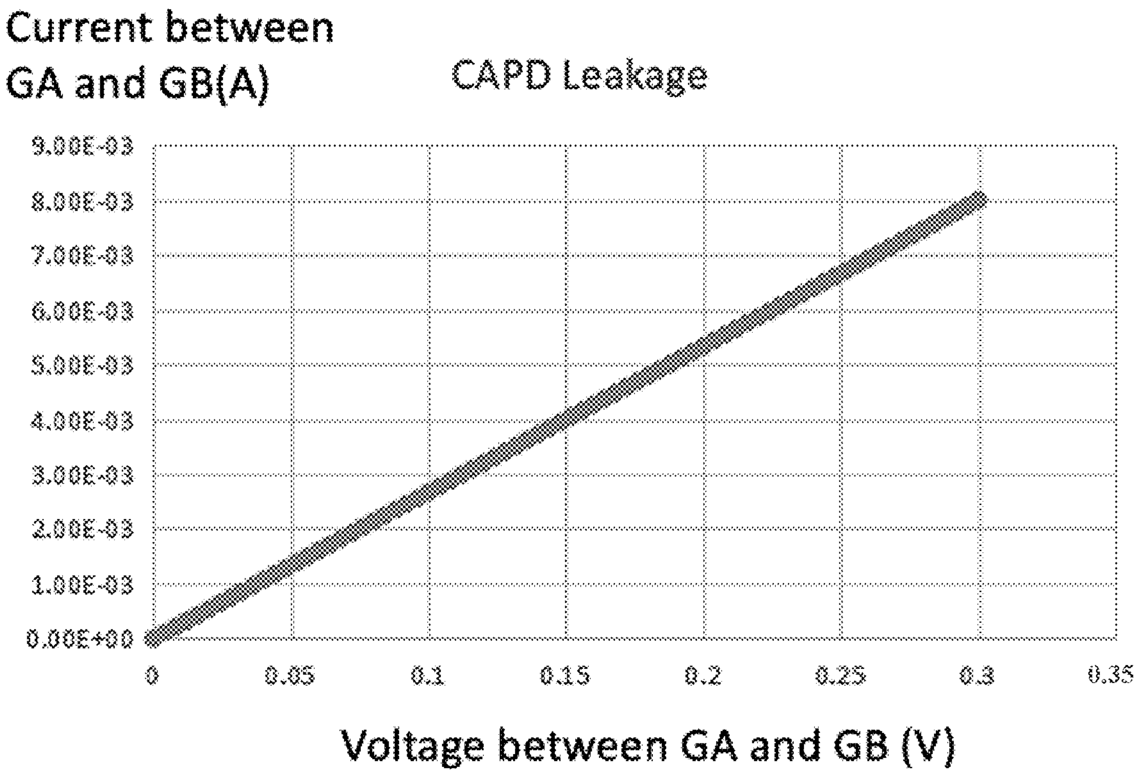
FIG. 10 is graph showing the leakage current between the guided regions GA and GB for the conventional photo-detector.
Figure 11:
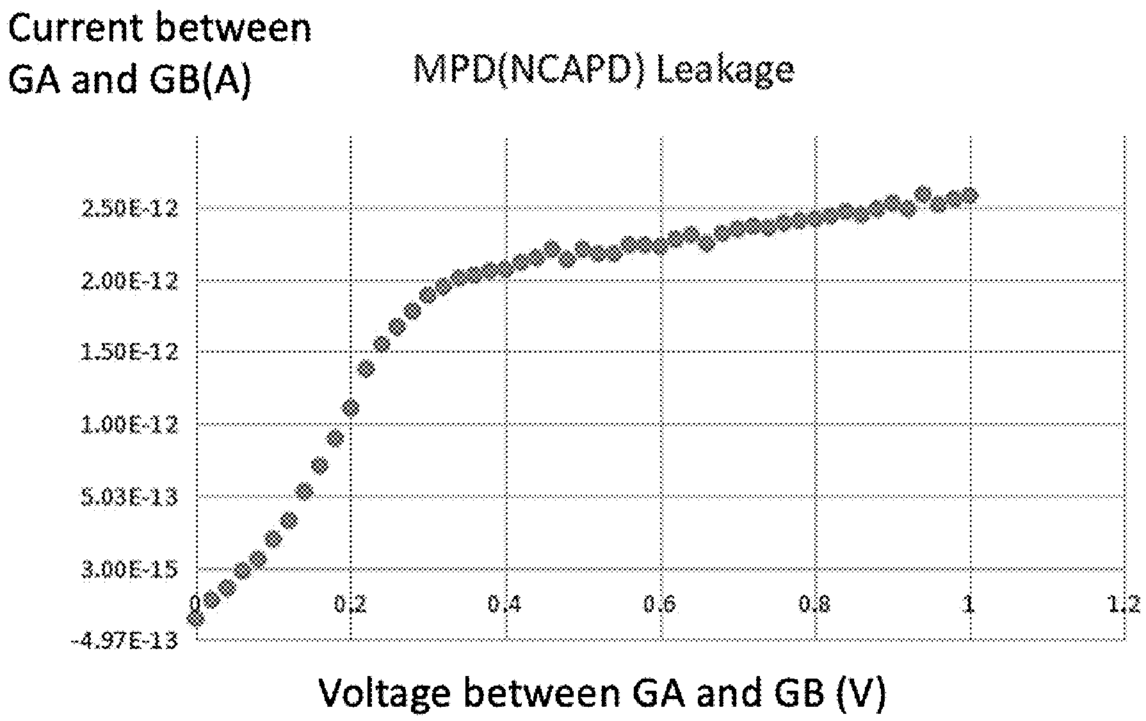
FIG. 11 is graph showing the leakage current between the guided regions GA and GB for the photo-detector in accordance with the first embodiment of the present disclosure.
Figure 12:
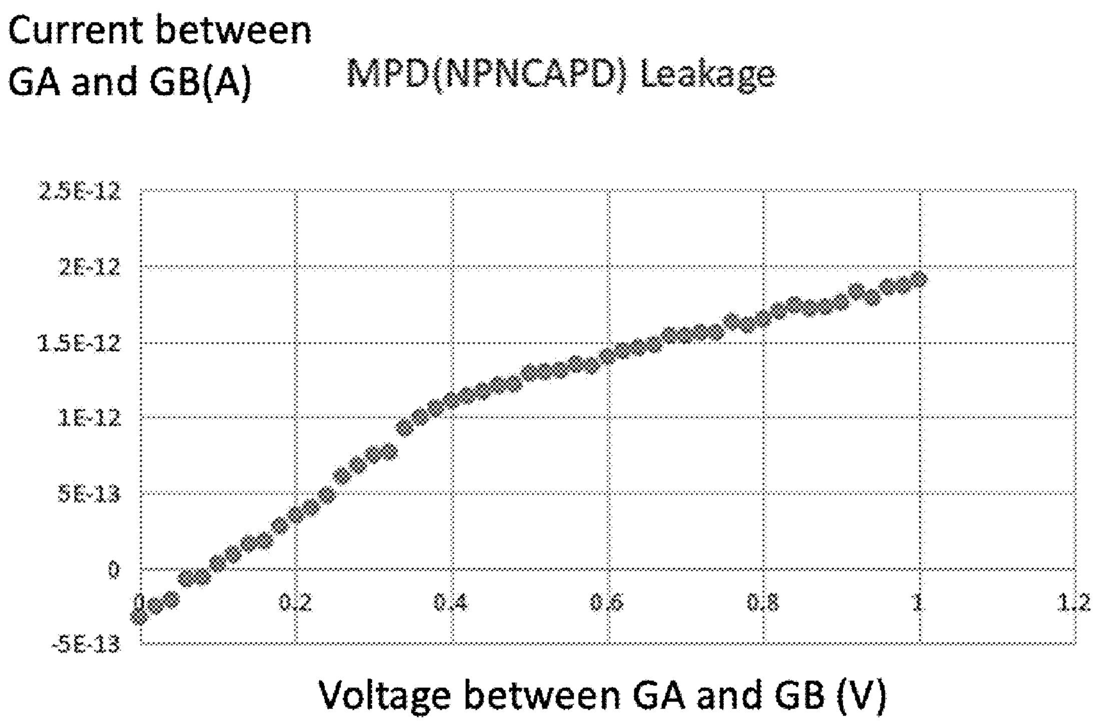
FIG. 12 is graph showing the leakage current between the guided regions GA and GB for the photo-detector in accordance with the second embodiment of the present disclosure.

FIG. 10 shows the leakage current between the two guided regions GA and GB 140, 150 for a conventional CAPD when the voltage between the two guided regions GA and GB 140, 150 increases. In contrast, FIGS. 11-12 show the leakage current between the two guided regions GA and GB 140, 150 for the photo-detectors 200 of the first and the second embodiments of the present disclosure when the voltage between the two guided regions GA and GB 140, 150 increases. The leakage current in the conventional CAPD is increased linearly to $8e^{-3}$ A when the voltage difference is increased to 0.3V, whereas, the leakage current is much reduced for the two exemplary photo-detectors of the present disclosure. In the first embodiment as shown in FIG. 11, the leakage current is saturated at around $2e^{-12}$ A when the voltage is increased to 0.35V. Similarly, in the second embodiment as shown in FIG. 12, the leakage current is only around $1.2e^{-12}$ A when the voltage is increased to 0.4V. Therefore, the leakage current is significantly reduced in the photo-detector 200 of the present disclosure as the photo sensing region 210 forms at least a pn junction between the two guided regions 140, 150 that is reverse biased so as to reduce or prevent a leakage path between the two guided regions 140, 150.

Figure 13:
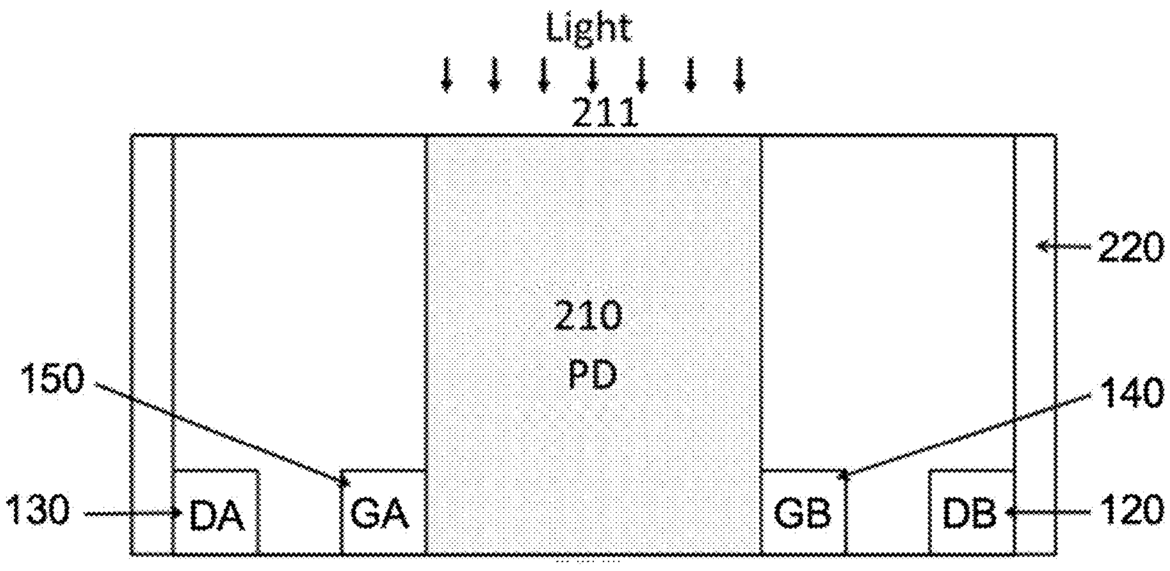
FIG. 13 depicts a cross-section of the photo-detector in accordance with the first embodiment of the present disclosure in BSI structure.

FIG. 13 provides a common variant of the CMOS photo-detector in which the device is flipped up-side-down, with a similar structure as of the photo-detector of FIG. 4. This is known as a BSI structure. The back side of the substrate 110 is used as the sensing region with the guided regions GA and GB 140, 150 and the detection region DA and DB 120, 130. The light receiving region 211 is provided on the front side of the substrate 110 to allow an impingement of electromagnetic radiation into the photo sensing region 210. The two guided regions 140, 150 and two detection regions 120, 130 are still formed in the semiconductor substrate 110 outside the light receiving region 211, but on the back side. By having the photo-detector 200 flipped, it can be bonded to another wafer from the back side. Therefore, the top side can be thinned down such that the light can enter from the back side and reached the front side of the original structure.

Figure 14:
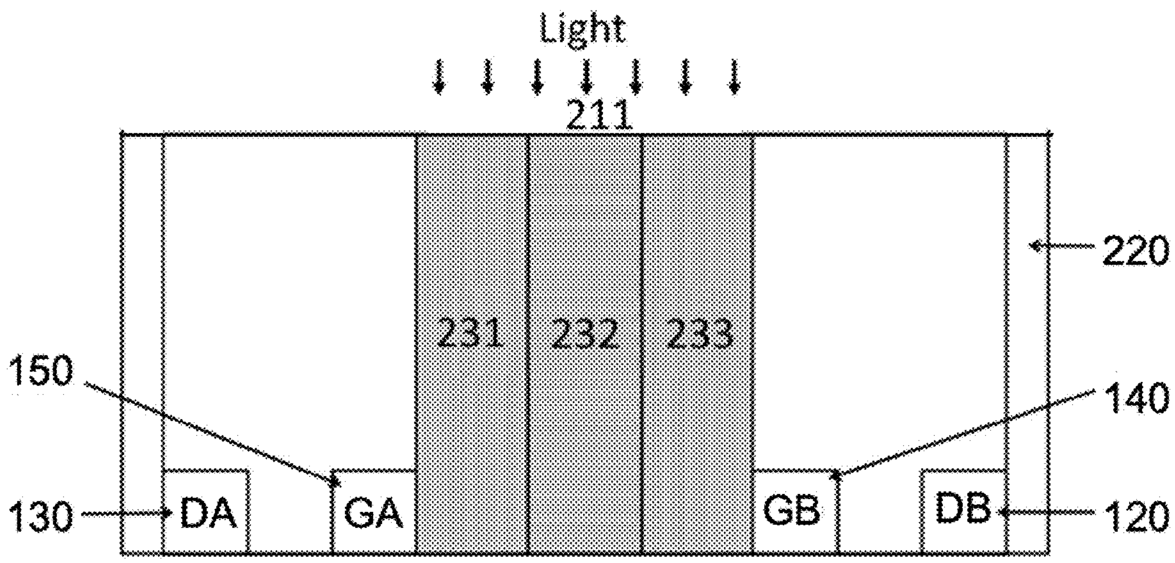
FIG. 14 depicts a cross-section of the photo-detector in accordance with the second embodiment of the present disclosure in BSI structure.
Figure 15:
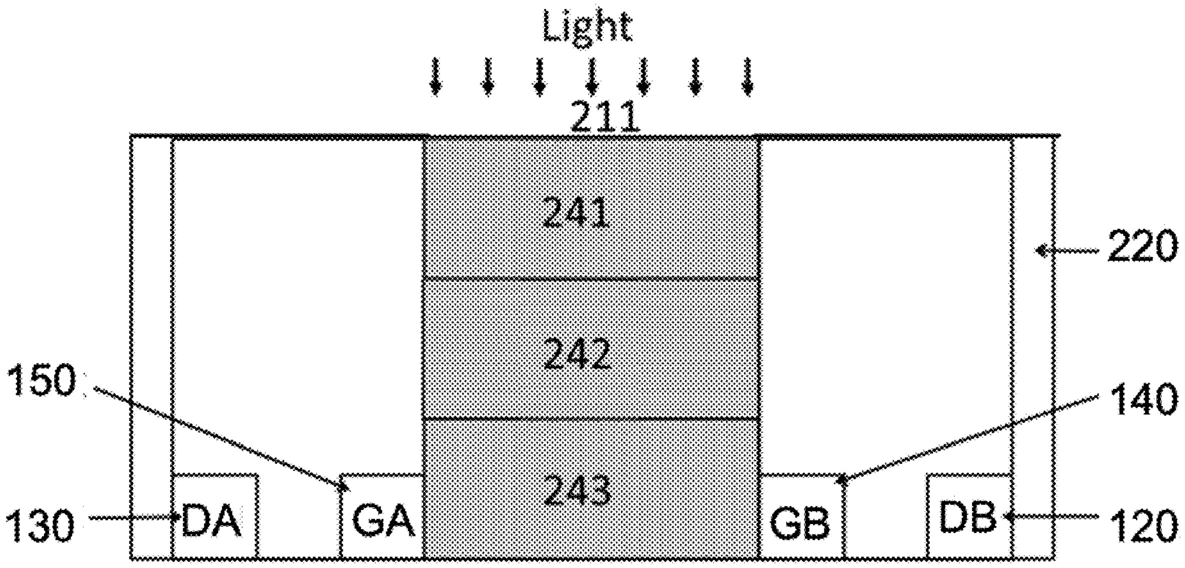
FIG. 15 depicts a cross-section of the photo-detector in accordance with the third embodiment of the present disclosure in BSI structure.

FIGS. 14-15 provide the BSI structure of the photo-detector equivalent to that of FIGS. 5-6.

The present disclosure provides the case where the first conductive type of dopant is a p-type doping, and the second conductive type of dopant is an n-type doping. It is apparent to those skilled in the art that equivalently, the present disclosure is also applicable to the case where the photo-detector 200 is formed in similar way with opposite doping polarity. That is, the first conductive type of dopant is an n-type doping, and the second conductive type of dopant is a p-type doping.

This illustrates the fundamental structure of the low power photo-detector and the TOF image sensor for detecting an impinging electromagnetic radiation from a received light in accordance with the present disclosure. It will be apparent that variants of the above-disclosed and other features and functions, or alternatives thereof, may be combined into many other different methods or apparatuses. The modules, circuit blocks, and components in the TOF image sensor are recited as examples illustrating the concepts and the embodiments of the present disclosure, and can be substituted with other generic modules, components, or circuit blocks throughout the specification. The present embodiment is, therefore, to be considered in all respects as illustrative and not restrictive. The scope of the disclosure is indicated by the appended claims rather than by the preceding description, and all changes that come within the meaning and range of equivalency of the claims are therefore intended to be embraced therein.

What is claimed is:

1. A photo-detector for detecting photons generated by a received light, the photo-detector comprising:

a semiconductor substrate doped with a first conductive type of dopant;

two or more guided regions formed in the semiconductor substrate and doped with the first conductive type of dopant;

a photo sensing region disposed between the two or more guided regions for an impinging photon from the received light to generate photo carriers; and two or more detection regions formed in the semiconductor substrate and doped with a second conductive type of dopant, wherein:

the two or more guided regions are respectively connected to power sources to apply an electric potential across the two or more guided regions for controlling a detectivity of the impinging photon; and the photo sensing region is provided to form at least a pn junction between the two or more guided regions that is reverse biased so as to reduce or prevent a leakage path between the two or more guided regions, wherein the photo sensing region comprises three or more sub-regions, wherein any two adjacent sub-regions are doped with different conductive type of dopants selected from the first and the second conductive type of dopants such that at least two pn junctions are formed for the three or more sub-regions, wherein the at least two pn junctions are configured to be reverse biased such that their depletion regions merge to fully deplete the photo sensing region, wherein the photo-detector further comprises an isolation region forming a ring-like surrounding structure arranged to surround the two or more guided regions and the two or more detection regions, so as to isolate the two or more guided regions and the two or more detection regions from the semiconductor substrate, and wherein the isolation region is doped with the second conductive type of dopant opposite to the first conductive type.

2. The photo-detector of claim 1, wherein the three or more sub-regions are arranged laterally alternating to form a lateral sequence of doping regions.

3. The photo-detector of claim 1, wherein the three or more sub-regions are arranged vertically alternating to form a vertical sequence of doping regions.

4. The photo-detector of claim 1, wherein the two or more guided regions comprise a first guided region positioned immediately adjacent to a first side of the photo sensing region, and a second guided region positioned immediately adjacent to a second side of the photo sensing region.

5. The photo-detector of claim 1, wherein the first conductive type of dopant is a p-type doping, and the second conductive type of dopant is an n-type doping.

6. The photo-detector of claim 1, wherein the first conductive type of dopant is an n-type doping, and the second conductive type of dopant is a p-type doping.

7. The photo-detector of claim 1, wherein the two or more guided regions and the two or more detection regions are formed in a back side of the semiconductor substrate such that the photo-detector has a back-side illumination structure.

8. A time-of-flight imaging system for performing distance measurement and 3D imaging, comprising:

a modulated light source for transmitting a light pulse to a target object;

a processor; and a receiving unit comprising one or more phase-sensitive photo-detectors for detecting photons generated by a received light reflected from the target object, wherein each individual phase-sensitive photo-detector comprises:

a semiconductor substrate doped with a first conductive type of dopant;

two or more guided regions formed in the semiconductor substrate and doped with the first conductive type of dopant;

a photo sensing region disposed between the two or more guided regions for sensing an impinging photon from the received light by generating photo carriers; and two or more detection regions formed in the semiconductor substrate and doped with a second conductive type of dopant, wherein:

the two or more guided regions are respectively connected to power sources to apply an electric potential across the two or more guided regions for controlling a detectivity of the impinging photon; and the photo sensing region is provided to form at least a pn junction between the two or more guided regions that is reverse biased so as to reduce or prevent a leakage path between the two or more guided regions, wherein the photo sensing region comprises three or more sub-regions, wherein any two adjacent sub-regions are doped with different conductive type of dopants selected from the first and the second conductive type of dopants such that at least two pn junctions are formed for the three or more sub-regions, wherein the at least two pn junctions are configured to be reverse biased such that their depletion regions merge to fully deplete the photo sensing region, wherein the individual phase-sensitive photo-detector further comprises an isolation region forming a ring-like surrounding structure arranged to surround the two or more guided regions and the two or more detection regions, so as to isolate the two or more guided regions and the two or more detection regions from the semiconductor substrate, and wherein the isolation region is doped with the second conductive type of dopant opposite to the first conductive type.

9. The time-of-flight imaging system of claim 8, wherein the three or more sub-regions are arranged laterally alternating to form a lateral sequence of doping regions.

10. The time-of-flight imaging system of claim 8, wherein the three or more sub-regions are arranged vertically alternating to form a vertical sequence of doping regions.

11. The time-of-flight imaging system of claim 8, wherein the two or more guided regions comprise a first guided region positioned immediately adjacent to a first side of the photo sensing region, and a second guided region positioned immediately adjacent to a second side of the photo sensing region.

12. The time-of-flight imaging system of claim 8, wherein the first conductive type of dopant is a p-type doping, and the second conductive type of dopant is an n-type doping.

13. The time-of-flight imaging system of claim 8, wherein the first conductive type of dopant is an n-type doping, and the second conductive type of dopant is a p-type doping.

14. The time-of-flight imaging system of claim 8, wherein the two or more guided regions and the two or more detection regions are formed in a back side of the semiconductor substrate such that the photo-detector has a back-side illumination structure.

* * * * *